(12) United States Patent
Lai et al.

(10) Patent No.: US 9,459,144 B2
(45) Date of Patent: Oct. 4, 2016

(54) OPTICAL SPECTROSCOPY DEVICE, PROCESS OF MAKING THE SAME, AND METHOD OF USING THE SAME

(71) Applicant: Taiwan Semiconductor Manufacturing Company, Ltd., Hsin-Chu (TW)

(72) Inventors: Jui Hsieh Lai, Taoyuan (TW); Ying-Hao Kuo, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/987,078

(22) Filed: Jan. 4, 2016

(65) Prior Publication Data

US 2016/0116335 A1 Apr. 28, 2016

Related U.S. Application Data

(63) Continuation of application No. 14/076,508, filed on Nov. 11, 2013, now Pat. No. 9,228,896.

(51) Int. Cl.

| G01J 3/00 | (2006.01) |
| --- | --- |
| G01J 3/02 | (2006.01) |
| G01J 3/18 | (2006.01) |
| G01J 3/28 | (2006.01) |
| H01L 31/18 | (2006.01) |
| H01L 31/0232 | (2014.01) |
| G02B 6/42 | (2006.01) |
| H01L 27/146 | (2006.01) |

(52) U.S. Cl.
CPC ............ *G01J 3/0205* (2013.01); *G01J 3/0259* (2013.01); *G01J 3/1895* (2013.01); *G01J 3/28* (2013.01); *G02B 6/42* (2013.01); *H01L 27/1464* (2013.01); *H01L 27/14625* (2013.01); *H01L 27/14629* (2013.01); *H01L 27/14643* (2013.01); *H01L 27/14685* (2013.01); *H01L 31/02327* (2013.01); *H01L 31/18* (2013.01)

(58) Field of Classification Search
CPC ................ G01J 3/02; G01J 3/28; G01J 3/42; G01N 21/31; G01N 21/552
USPC .................................................. 356/300–445
See application file for complete search history.

(56) References Cited

U.S. PATENT DOCUMENTS

| 7,106,778 | B2 * | 9/2006 | Reid .................. H01S 5/06256 372/102 |
| 9,228,896 | B2 * | 1/2016 | Lai ........................ G01J 3/1895 |
| 2008/0089697 | A1 * | 4/2008 | Shen .................... H04B 10/506 398/183 |
| 2009/0154871 | A1 | 6/2009 | Pyo et al. |

* cited by examiner

*Primary Examiner* — Abdullahi Nur
(74) *Attorney, Agent, or Firm* — Slater Matsil, LLP

(57) ABSTRACT

An optical spectroscopy device includes a first cladding layer is positioned over a photodetector. An optical core region is over the first cladding layer where the optical core region is configured to receive a light beam. The optical core region includes a first grating having a first pitch where the first pitch is positioned to direct a first wavelength of the light beam to a first portion of the photodetector. The optical core region further includes a second grating having a second pitch where the second grating is positioned to direct a second wavelength of the light beam to a second portion of the photodetector. The first pitch is different from the second pitch, the first wavelength is different from the second wavelength, and the first portion of the photodetector is different from the second portion of the photodetector. Additionally, a second cladding layer is over the optical core region.

20 Claims, 3 Drawing Sheets

OPTICAL SPECTROSCOPY DEVICE, PROCESS OF MAKING THE SAME, AND METHOD OF USING THE SAME

PRIORITY CLAIM AND CROSS-REFERENCE

This application claims the benefit to and is a continuation of U.S. patent application Ser. No. 14/076,508, filed on Nov. 11, 2013, and entitled "Optical Spectroscopy Device, Process of Making the Same, and Method of Using the Same" which application is incorporated herein by reference.

BACKGROUND

Optical spectroscopy is used for various sensory applications. One way of making an optical spectroscope includes directing a light beam containing various wavelengths at a grating. The grating diffracts the light beam. An angle of diffraction of the diffracted light beam depends on a wavelength of the light beam and an incident angle of the light beam. The various wavelengths of the light beam are diffracted at different angles by the grating due to the difference in wavelength. The diffracted light is then directed to a photodetector. A location at which the light beam contacts the photodetector is determined by the wavelength of the light beam. By detecting an amount of light at each location, the photodetector is capable of determining a spectrum of the light beam.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting. The making and using of illustrative embodiments are discussed in detail below. It should be appreciated; however, that the disclosure provides many applicable inventive concepts that can be embodied in a wide variety of specific contexts. In at least some embodiments, one or more embodiment(s) detailed herein and/or variations thereof are combinable with one or more embodiment(s) herein and/or variations thereof.

Figure 1:
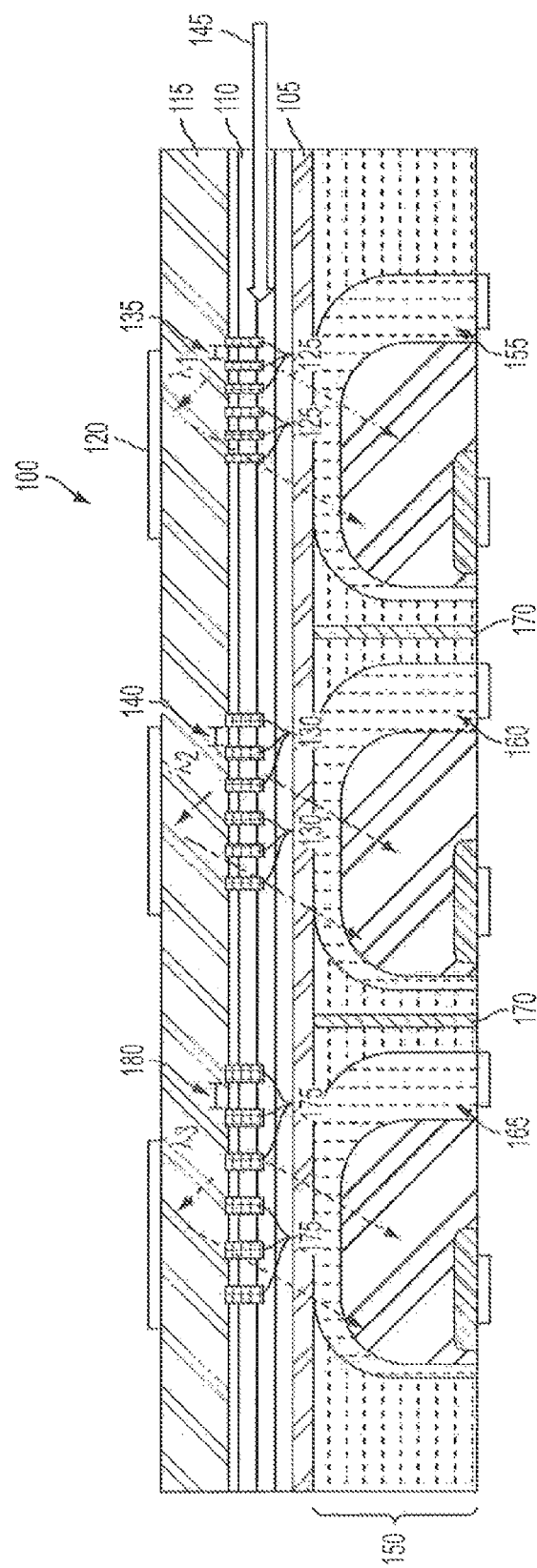
FIG. 1 is a cross-sectional view of an optical spectroscopy device in accordance with one or more embodiments.

FIG. 1 is a cross-sectional view of an optical spectroscopy device 100 in accordance with one or more embodiments. Optical spectroscopy device 100 includes a first cladding layer 105. An optical core region 110 is positioned over first cladding layer 105. A second cladding layer 115 is positioned over optical core region 110. A screen reflector 120 is positioned over second cladding layer 115. A light beam 145 which includes various wavelengths ranging from 400 nanometers (nm) to 2000 nm enters optical spectroscopy device 100 through optical core region 110. Optical spectroscopy device 100 further includes a photodetector 150 in contact with first cladding layer 105.

Optical core region 110 includes a first grating 125 having a first pitch 135 and a second grating 130 having a second pitch 140. First pitch 135 is different from second pitch 140. Optical core 110 includes a third grating 175 having a third pitch 180. In some embodiments, less than three gratings are used.

First cladding layer 105 is for controlling propagation of light beam 145 within optical core region 110. Within a specific incident angle range, light beam 145 is reflected at an interface between first cladding layer 105 and optical core region 110 due to a difference in refractive index between the first cladding layer and the optical core region. In some embodiments, first cladding layer 105 includes $SiO_2$, SiON, polymer, a dielectric, or another suitable material. In some embodiments, first cladding layer 105 has a thickness ranging from 0.2 micrometers ($\mu$m) to 10 $\mu$m. In some embodiments, if the incident angle of light beam 145 at the interface between first cladding layer 105 and optical core region 110 exceeds a threshold value, then the light beam enters the first cladding layer.

Optical core region 110 is for receiving light beam 145 from an external source. Optical core region 110 is positioned over first cladding layer 105. In some embodiments, optical core region 110 includes a polymer, poly-p-phenylenebenzobisoxazole (PBO), $SiN_x$, polysilicon, a high-k dielectric material, or another suitable material. Optical core region 110 has a refraction index higher than a refraction index of first cladding layer 105. In some embodiments, optical core region 110 has a thickness ranging from 0.2 $\mu$m to 10 $\mu$m. Optical core region 110 further includes an acceptance cone which defines an incident angle at which light beam 145 is able to enter the optical core region. When light beam 145 enters optical core region 110, the light beam remains within the optical core region. When light beam 145 is outside the acceptance cone, the light beam is deflected into first cladding layer 105 or second cladding layer 115, or is reflected by a surface of optical core region 110.

First grating 125, formed in optical core region 110, diffracts light beam 145 and directs at least a portion of the light beam having a first wavelength toward photodetector 150. The first wavelength of light beam 145 being directed by first grating 125 is given by the diffraction grating equation.

$$d\sin(\emptyset)=m\lambda$$

In the above equation, d denotes the grating pitch, $\emptyset$ denotes the diffraction angle, m denotes the wave-number, and $\lambda$ denotes the wavelength of the light beam being diffracted. In some embodiments, first grating 125 also directs another portion of light beam 145 having the first wavelength to screen reflector $120_1$. In some embodiments, first grating 125 includes Al, Ti, W, Co, Cu, Au, Ag, AlN, a high-k dielectric layer, silicon, or another suitable material. First grating 125 has a first pitch 135. First pitch 135 ranges from 80 nanometers (nm) to 5000 nm.

Second grating 130, formed in optical core region 110, diffracts light beam 145 and directs at least a portion of the light beam having a second wavelength toward photodetector 150. The second wavelength of light beam 145 being directed by second grating 125 is given by the diffraction grating equation. In some embodiments, second grating 130 also directs another portion of light beam 145 having the second wavelength to screen reflector 120$_2$. In some embodiments, second grating 130 includes Al, Ti, W, Co, Cu, Au, Ag, AlN, a high-k dielectric layer, silicon, or another suitable material. Second grating 130 has a second pitch 140. Second pitch 140 has a ranges from 80 nanometers (nm) to 5000 nm. Second pitch 140 is different from first pitch 135. In some embodiments, second pitch 140 is greater than first pitch 135. In some embodiments, second pitch 140 is less than first pitch 135.

Third grating 175, formed in optical core region 110, diffracts light beam 145 and directs at least a portion of the light beam having a third wavelength toward photodetector 150. The third wavelength of light beam 145 being directed by third grating 175 is given by the diffraction grating equation. In some embodiments, third grating 175 also directs another portion of light beam 145 having the third wavelength to screen reflector 120$_3$. In some embodiments, third grating 175 includes Al, Ti, W, Co, Cu, Au, Ag, AlN, a high-k dielectric layer, silicon, or another suitable material. Third grating 175 has a third pitch 180. Third pitch 180 has a ranges from 80 nanometers (nm) to 5000 nm. Third pitch 140 is different from first pitch 135 and second pitch 140. In some embodiments, third pitch 180 is greater than at least one of first pitch 135 and second pitch 140. In some embodiments, third pitch 180 is less than at least one of first pitch 135 and second pitch 140.

In some embodiments, at least three gratings, each having a separate pitch, are formed in optical core region 110. Each one of these gratings diffracts a separate and distinct wavelength of light beam 145. The remaining wavelengths of light beam 145 which are not diffracted propagate in optical core region 110. The remaining wavelengths of light beam 145 are eventually diffracted by the gratings having the appropriate pitches. The wavelengths of light beam 145 which are not diffracted by any grating are either absorbed by optical core region 110 or exits out of a second end of the optical core region.

Second cladding layer 115 is for directing light beam 145. In comparison with first cladding layer 105, second cladding layer 115 is formed over optical core region 110. In some embodiments, second cladding layer includes SiO2, polymer, a dielectric, or another suitable material. In some embodiments, second cladding layer has a thickness ranging from 0.2 μm to 10 μm. In some embodiments, the light beam is either absorbed by second cladding layer 115 or directed out of an end of second cladding layer.

Screen reflector 120 is used for reflecting light beam 145 back to photodetector 150. Screen reflector 120 is over second cladding layer 115. In some embodiments, screen reflector 120 includes copper (Cu), aluminum (Al), gold (Au), silver (Ag), or another suitable reflective material. In some embodiments, screen reflector 120 has a thickness of at least 50 nm. In some embodiments, screen reflector 120 stretches across an entirety of second cladding layer 115. In some embodiments, screen reflector 120 extends along a portion of second cladding layer 115 which corresponds to a location of photodetector 150.

Photodetector 150 is used for sensing various wavelengths of diffracted light beam 145. In some embodiments, photodetector 150 includes a charged coupled device (CCD), a complementary metal oxide semiconductor (CMOS) detector, a back-side illumination (BSI) sensor or another suitable light detecting element. Photodetector 150 includes a first photodetecting region 155, a second photodetecting region 160, and a third photodetecting region 165. First photodetecting region 155, second photodetecting region 160, and third photodetecting region 165 are separated by an isolation region 170. In some embodiments, first photodetecting region 155, second photodetecting region 160, and third photodetecting region 165 independently include Si-based or Ge-based pixel photodetectors for detecting diffracted portions of light beam 145.

In operation, first photodetecting region 155 receives a first wavelength of diffracted light beam 145 from at least one of first grating 125 or screen reflector 120$_1$. Second photodetecting region 160 receives a second wavelength of diffracted light beam 145 which is directed from at least one of second grating 130, or metal screen reflector 120$_2$. The photodetector is able to detect wavelengths ranging from 400 nm to 2000 nm. In some embodiments, there are more than two photodetecting regions. Each of these photodetecting regions receive a separate and distinct wavelength of diffracted light beam 145.

Figure 2:
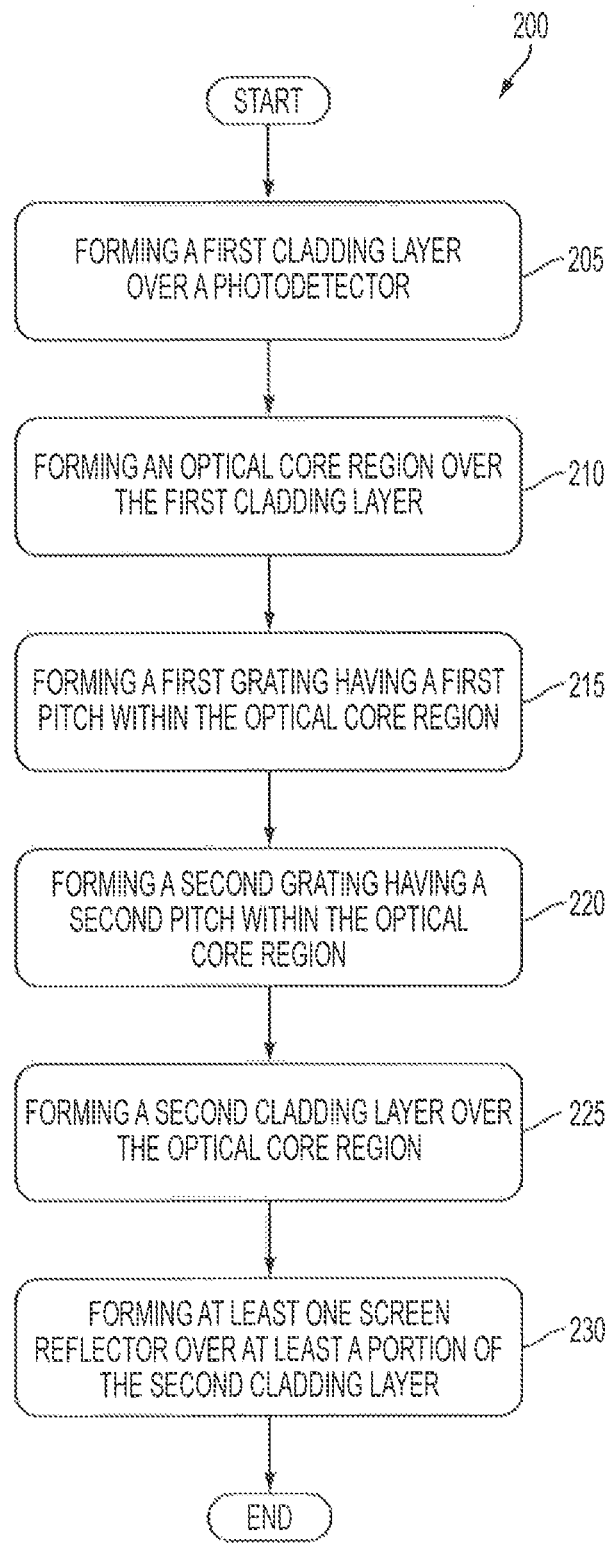
FIG. 2 is a flow chart of a method of making an optical spectroscopy device m accordance with one or more embodiments.

FIG. 2 is a flow chart of a method 200 of making an optical spectroscopy device in accordance with one or more embodiments.

Method 200 begins with operation 205 in which a first cladding layer is formed over a photodetector configured to receive a light beam. In some embodiments, the first cladding layer, e.g., first cladding layer 105 (FIG. 1), is formed using physical vapor deposition (PVD), chemical vapor deposition (CVD), sputtering, spin-on coating or another suitable formation method. In some embodiments, the first cladding is formed to a thickness ranging from about 0.2 μm to about 10 μm. In some embodiments, the first cladding layer includes SiO$_2$, SiON, polymer, a dielectric, or another suitable material.

In operation 210, an optical core region is formed over the first cladding layer. In some embodiments, the optical core region, e.g., optical core region 110 (FIG. 1), is formed using PVD, CVD, sputtering, spin-on coating or another suitable formation method. A refraction index of the optical core region is higher than a refraction index of the first cladding layer. In some embodiments, a difference in the refraction index of the optical core region and the refraction index of the first cladding layer ranges from about 0.05 to about 1.0. A material of the optical core region is selected to be transparent to a desire waveband of light. In some embodiments, at least 85% of the light beam is transmitted by the optical core region. In some embodiments, at least 95% of the light beam is transmitted by the optical core region. In some embodiments, the optical core region includes a polymer, PBO, SiN$_x$, polysilicon, a high-k dielectric material, or another suitable material. In some embodiments, the high-k dielectric material includes SiN, AhO$_3$, HfO$_2$, TiO$_2$, Ti$_2$O$_5$, or other suitable high-k dielectric materials. In some embodiments, a thickness of the optical core region ranges from about 0.2 μm to about 10 μm.

In operation 215, a first grating having a first pitch is formed within the optical core region. The first grating is formed by defining first grating openings in the optical core region. The first grating openings have a first pitch, e.g., first pitch 135 (FIG. 1). The first pitch ranges from 80 nm to 5000 nm. The grating openings are formed in the optical core region using a photolithography/etching processes. In some embodiments, the optical core region is etched using a plasma etching process. The plasma etching process helps to form sidewalls for the grating openings substantially perpendicular to a top surface of the optical core region. In some embodiments, an angle between a normal of the top surface of the optical core region and the sidewalls of the grating openings is less than about 5-degrees. The substantially perpendicular sidewalls of the grating openings help to control the diffraction angle of a first grating formed using the grating openings. In some embodiments, an angle between a normal of the top surface of the optical core region and the sidewalls of the grating openings is greater than 5-degrees.

The first grating openings are then filled to create the first grating. The first grating substantially fills the grating openings, e.g., first grating 125 (FIG. 1). In some embodiments, the first grating includes Al, Ti, W, Co, Cu, Au, Ag, MN, a high-k dielectric layer, silicon or other suitable reflective materials. In some embodiments, the reflective material is formed using electroplating, PVD, sputtering, atomic layer deposition (ALD) or other suitable formation methods.

In operation 220, a second grating having a second pitch is formed within the optical core region. The formation method of the second grating is substantially similar to the formation method of the first grating. In some embodiments, grating openings for the second grating are different in size than the grating openings for the first grating. The second pitch has a range from 80 nm to 5000 nm. In some embodiments, the second grating, e.g., second grating 130 (FIG. 1), is formed using electroplating, PVD, CVD, sputtering, ALD, or another suitable formation method. In some embodiments, the formation method of the second grating is different from the formation method of the first grating. In some embodiments, the material of the second grating is the same as the material of the first grating. In some embodiments, the material of the second grating is different from the material of the first grating.

In operation 225, a second cladding layer is formed over the optical core region. In some embodiments, the second cladding layer, e.g., second cladding layer 115 (FIG. 1), is formed using PVD, CVD, sputtering, spin-on coating or another suitable formation method. In some embodiments, the formation method of the second cladding layer is the same as the formation method of the first cladding layer. In some embodiments, the formation method of the second cladding layer is different from the formation method of the first cladding layer. In some embodiments, the second cladding layer is formed to a thickness ranging from about 0.2 μm to about 10 μm. In some embodiments, the thickness of the second cladding layer is the same as the thickness of the first cladding layer. In some embodiments, the thickness of the second cladding layer is different from the thickness of the first cladding layer. In some embodiments, the second cladding layer includes $SiO_2$, SiON, polymer, a dielectric, or another suitable material. In some embodiments, the material of the second cladding layer is the same as the material of the first cladding layer. In some embodiments, the material of the second cladding layer is different from the material of the first cladding layer.

In operation 230, at least one screen reflector is formed over the second cladding layer. The screen reflector, e.g., screen reflector 120 (FIG. 1), is positioned to receive a portion of the light beam diffracted by at least one of the first grating, or the second grating. The screen reflector is formed over the second cladding layer by any suitable method, such as PVD, blanket deposition, CVD, electrochemical deposition (ECD), molecular beam epitaxy (MBE), ALD, electroplating, or another suitable method.

In some embodiments, the optical spectroscopy device is used in a photodetector such as a charged coupled device (CCD), a complementary metal oxide semiconductor (CMOS) detector, a back-side illumination (BSI) sensor or another suitable light detecting element. In some embodiments, the optical spectroscopy device is fixed over the photodetector by an optical adhesive. The optical adhesive is transparent to the desired waveband of light. In some embodiments, the optical spectroscopy device and the photodetector are bound together by a process of wafer-bonding.

One of ordinary skill in the art would recognize that operations are added or removed from method 200, in one or more embodiments. One of ordinary skill in the art would also recognize that an order of operations in method 200 is able to be changed, in some embodiments.

Figure 3:
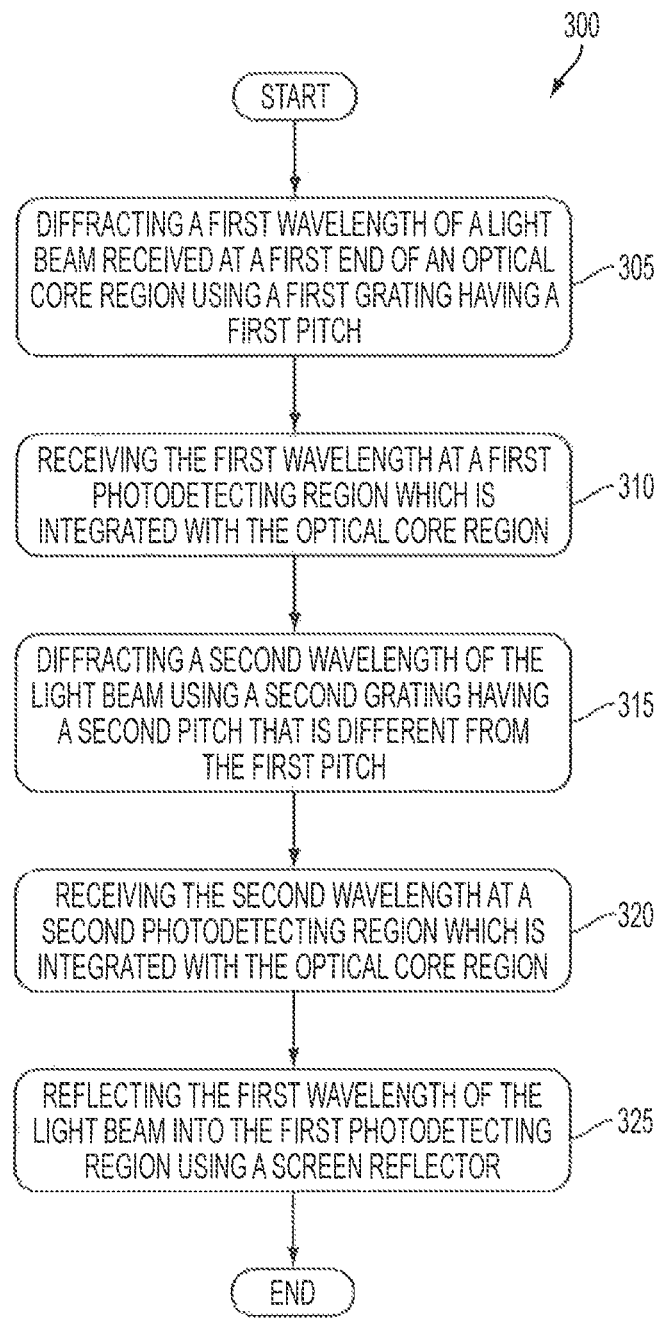
FIG. 3 is a flow chart of a method of using an optical spectroscopy device m accordance with one or more embodiments.

FIG. 3 is a flow chart of a method 300 of using an optical spectroscopy device in accordance with one or more embodiments.

In operation 305, a first wavelength of a light beam received at a first end of an optical core region is diffracted using a first grating having a first pitch. The first grating, e.g., first grating 125 (FIG. 1), receives the light beam that is propagated from the first end of the optical core region. The first wavelength of the light beam ranges from 400 nm to 2000 nm. In some embodiments, the light beam is received from an external light source.

In operation 310, the first wavelength of the light beam 1 s received at a first photodetecting region which is integrated with the optical core region. The first photodetecting region is part of a photodetector, e.g., first photodetecting 155 (FIG. 1), receives the first wavelength of the light beam. In some embodiments, the first photodetecting region receives the first wavelength from a screen reflector.

In operation 315, a second wavelength of the light beam is diffracted using a second grating having a second pitch different from the first pitch. The second grating, e.g., second grating 130 (FIG. 1), receives remaining wavelengths of light beam from the first grating. The second grating, e.g., second grating 130 (FIG. 1), diffracts the second wavelength of the light beam. The second wavelength of the light beam ranges from 400 nm to 2000 nm. The second wavelength is different from the first wavelength.

In operation 320, the second wavelength is received at a second photodetecting region. The second photodetecting region which is part of the photodetector receives the second wavelength of the light beam. The second photodetecting region is separated from the first photodetecting region by an isolation region. In some embodiments, the second photodetecting region receives the second wavelength from a screen reflector.

In operation 325, the first wavelength of the light beam is reflected into the first photodetecting region using a screen reflector. The screen reflector, e.g., screen reflector 120 (FIG. 1), reflects at least one of the first wavelength or the second wavelength of the light beam directed from at least one of the first grating or second grating into the optical core region.

One of ordinary skill in the art would recognize that operations are added or removed from method 300, in one or more embodiments. One of ordinary skill in the art would also recognize that an order of operations in method 300 is able to be changed, in some embodiments.

Various embodiments of the present disclosure involve methods of making a low-cost, low-profile optical spectroscopy device that can fit into lots of consumer electronics and photodetectors. As previously discussed, an optical spectroscopy device 100 with the proper grating design reduces interference from high order diffraction. The optical spectroscopy device also expedites data collection and extraction through CMOS image sampling circuit and DSP.

One aspect of this description relates to an optical spectroscopy device. The optical spectroscopy device includes a photodetector, and a first cladding layer is positioned over the photodetector. An optical core region is over the first cladding layer where the optical core region is configured to receive a light beam. The optical core region includes a first grating having a first pitch where the first pitch is positioned to direct a first wavelength of the light beam to a first portion of the photodetector. The optical core region further includes a second grating having a second pitch where the second grating is positioned to direct a second wavelength of the light beam to a second portion of the photodetector. The first pitch is different from the second pitch, the first wavelength is different from the second wavelength, and the first portion of the photodetector is different from the second portion of the photodetector. Additionally, a second cladding layer is over the optical core region.

Another aspect of this invention relates to a method of making an optical spectroscopy device. The method includes forming a first cladding layer over a photodetector. The method further includes forming an optical core region over the first cladding layer. The method also includes forming a first grating having a first pitch, and forming a second grating having a second pitch within the optical core region. The first pitch is different from the second pitch. Additionally, the method includes forming a second cladding layer over the optical core region.

Still another aspect of this invention relates to a method of using an optical spectroscopy device. The method includes redirecting a first wavelength of a light beam received at a first end of an optical core region using a first grating having a first pitch. The method further includes receiving the first wavelength at a first photodetecting region, the first photodetecting region being integrated with the optical core region. Additionally, the method includes diffracting a second wavelength of the light beam using a second grating, the second grating having a second pitch different from the first pitch. The method further includes receiving the second wavelength of the light beam into the second photodetecting region which is integrated with the optical core region.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a first cladding layer over a photodetector;
   an optical core region over the first cladding layer, the optical core region comprising:
   a first grating having a first pitch, the first grating being proximate a first portion of the photodetector; and
   a second grating having a second pitch, the second grating being proximate a second portion of the photodetector, the first pitch being different from the second pitch, the first portion of the photodetector being different from the second portion of the photodetector; and
   a second cladding layer over the optical core region.

2. The device of claim 1 further comprising:
   at least one screen reflector over at least a portion of the second cladding layer.

3. The device of claim 2, wherein the screen reflector comprises a metal.

4. The device of claim 1, wherein the optical core region has a refractive index higher than a refractive index of the first cladding layer.

5. The device of claim 1, the optical core region is configured to receive a light beam.

6. The device of claim 5, wherein the first grating is configured to direct a first wavelength of the light beam to the first portion of the photodetector, and wherein the second grating is configured to direct a second wavelength of the light beam to the second portion of the photodetector.

7. The device of claim 1, wherein the first pitch has a range from 80 nm to 5000 nm.

8. The device of claim 1 further comprising:
   a third grating having a third pitch, the third grating being proximate a third portion of the photodetector, the third pitch being different from the first pitch and the second pitch, the third portion of the photodetector being different from the first and second portions of the photodetector.

9. The device of claim 8, wherein the second portion of the photodetector is between the first portion of the photodetector and the third portion of the photodetector.

10. The device of claim 1 further comprising:
    an isolation region being interposed between the first portion of the photodetector and the second portion of the photodetector.

11. A device comprising:
    a first photodetecting region and a second photodetecting region in a photodetector;
    a first cladding layer over the first and second photodetecting regions of the photodetector;
    an optical core region over the first cladding layer, the optical core region having a refractive index higher than a refractive index of the first cladding layer, the optical core region further comprising:
    a first grating having a first pitch within the optical core region;
    a second grating having a second pitch within the optical core region, the first pitch being different from the second pitch;
    a second cladding layer over the optical core region; and
    at least one screen reflector over at least a portion of the second cladding layer.

12. The device of claim 11, wherein the optical core region comprises a polymer, poly-p-phenylenebenzobisoxazole (PBO), or SiNx.

13. The device of claim 11, wherein the first grating comprises Al, Ti, W, Co, Cu, Au, Ag, AlN, a high-k dielectric layer, or a silicon, and the second grating comprises Al, Ti, W, Co, Cu, Au, Ag, AlN, a high-k dielectric layer, or a silicon.

14. A method comprising:
    forming a first photodetecting region of a photodetector;

forming a second photodetecting region of the photodetector;

depositing a first cladding layer over the first and second photodetecting regions of the photodetector;

depositing an optical core region over the first cladding layer;

forming a first grating having a first pitch within the optical core region;

forming a second grating having a second pitch within the optical core region, the first pitch being different from the second pitch; and forming a second cladding layer over the optical core region.

15. The method of claim 14 further comprising:
forming at least one screen reflector over at least a portion of the second cladding layer.

16. The method of claim 14, wherein the optical core region has a refractive index higher than a refractive index of the first cladding layer.

17. The method of claim 14 further comprising:
forming a third photodetecting region of the photodetector; and
forming a third grating having a third pitch within the optical core region, the third pitch being different from the first pitch and the second pitch.

18. The method of claim 17, wherein the second photodetecting region is between the first photodetecting region and the third photodetecting region.

19. The method of claim 14, wherein the forming the first grating further comprises:
etching a first set of openings in the optical core region, the first set of openings having the first pitch; and
filling the first set of openings with a first material to form the first grating having the first pitch.

20. The method of claim 19, wherein the first material comprises Al, Ti, W, Co, Cu, Au, Ag, AN, a high-k dielectric layer, or a silicon layer.

* * * * *